(12) United States Patent
Appleyard

(10) Patent No.: US 6,876,154 B2
(45) Date of Patent: Apr. 5, 2005

(54) PLASMA PROCESSING APPARATUS

(75) Inventor: Nicholas John Appleyard, Bristol (GB)

(73) Assignee: Trikon Holdings Limited, Newport (GB)

(*) Notice: Subject to any disclaimer, the term of this patent is extended or adjusted under 35 U.S.C. 154(b) by 22 days.

(21) Appl. No.: 10/419,113

(22) Filed: Apr. 21, 2003

(65) Prior Publication Data
US 2003/0201722 A1 Oct. 30, 2003

Related U.S. Application Data
(60) Provisional application No. 60/392,049, filed on Jun. 28, 2002.

(30) Foreign Application Priority Data
Apr. 24, 2002 (GB) .............................. 0209291

(51) Int. Cl.[7] .................................. H01J 7/24
(52) U.S. Cl. .............................. 315/111.21; 315/111.41; 313/231.31
(58) Field of Search ................... 315/111.41, 111.21; 313/231.31

(56) References Cited

U.S. PATENT DOCUMENTS

| | | | |
|---|---|---|---|
| 3,418,206 A | 12/1968 | Hall et al. | |
| 4,401,054 A | 8/1983 | Matsuo et al. | |
| 4,609,428 A | 9/1986 | Fujimura | |
| 4,638,216 A | 1/1987 | Delaunay et al. | |
| 4,810,935 A | 3/1989 | Boswell | |
| 4,990,229 A | 2/1991 | Campbell et al. | |
| 5,189,446 A | 2/1993 | Barnes et al. | |
| 5,346,579 A | 9/1994 | Cook et al. | |
| 5,361,016 A | * 11/1994 | Ohkawa et al. | ......... 315/111.41 |
| 5,421,891 A | 6/1995 | Campbell et al. | |
| 5,429,070 A | 7/1995 | Campbell et al. | |
| 5,449,433 A | 9/1995 | Donohoe | |
| 5,567,268 A | 10/1996 | Kadomura | |
| 6,110,395 A | 8/2000 | Gibson, Jr. | |
| 6,189,484 B1 | 2/2001 | Yin et al. | |
| 6,251,792 B1 | 6/2001 | Collins et al. | |

FOREIGN PATENT DOCUMENTS

| | | |
|---|---|---|
| EP | 0283519 A1 | 9/1988 |
| JP | 62-216638 | 9/1987 |
| WO | WO 00/36631 | 6/2000 |

* cited by examiner

Primary Examiner—David Vu
(74) Attorney, Agent, or Firm—Volentine Francos & Whitt PLLC

(57) ABSTRACT

This invention relates to plasma processing apparatus and in particular, but not exclusively, to inductively coupled plasma helicon or electron cyclotron resonance apparatus. A plasma generation chamber is sat above a process chamber, in which is located a workpiece support. A plasma generation or source region exists and coils are provided to create magnetic mirrors above and below the plasma generation zone, whereby electrons will be reflected back towards the plasma zone and there is no electrical conductive path extending around or through at least the upper mirror.

41 Claims, 8 Drawing Sheets

PLASMA PROCESSING APPARATUS

CROSS-REFERENCE TO RELATED APPLICATIONS

A claim to priority is made to U.S. Provisional Application Ser. No. 60/392,049 filed Jun. 28, 2002 and to British Patent Application No. 0209291.4 filed Apr. 24$^{th}$ 2002, the contents of both applications being incorporated herein by reference in their entireties.

BACKGROUND OF THE INVENTION

1. Field of the Invention

This invention relates to plasma processing apparatus and in particular, but not exclusively, to inductively coupled plasma helicon or electron cyclotron resonance apparatus.

2. Description of Related Art

An early suggestion for the design of an inductively coupled plasma apparatus is described in U.S. Pat. No. 4,810,935, in which an antenna operates within an axial magnetic field upon a plasma source, which is coupled to a larger volume process chamber. This noted that, under these conditions, efficient coupling of the RF power could be achieved. This efficiency is due to the resonant response of the electrons' motions in the form of helicon plasma waves. The concept was further developed in U.S. Pat. No. 4,990,229, and other examples of helicon plasma source designs are contained in U.S. Pat. Nos. 5,449,433, 5,567,268 and 6,189,484.

In an alternative approach, power is supplied radiatively to the plasma to generate an electron cyclotron resonance (ECR), as described in U.S. Pat. No. 3,418,206. Here, high power transfer efficiency results from the resonant response of the electrons motions in the form of cyclotron orbits around the magnetic field. Some examples of the use of ECR sources for plasma processing can be found in U.S. Pat. Nos. 4,401,054, 4,609,428 and 4,638,216.

In both helicon and ECR designs, to optimise power absorption efficiency strong overlap, extending over a large volume of plasma, is required between the source electromagnetic fields and the electron motions at the excitation frequency.

Many possible RF antennae geometries can be used to excite plasma waves in a helicon source. These include the single loop and two loop antenna of U.S. Pat. No. 4,990,229, which couple to axially symmetric (m=0) wave modes, as well as geometries that couple to m=+1 modes. Practical antennae are of finite length and are therefore able to produce a range of wave numbers along the antenna axis (which is also the magnetic field direction). The coupling efficiency at each wave number will be determined in part by the antenna geometry, but also by the geometry of the wave modes, which is influenced by the chamber walls, the magnetic field profile and the electron density profile in the vicinity of the antenna. Strong variations in field strength or electron density affect the wave propagation and cause strong spatial variations in the amplitude and wave number, making it difficult to couple efficiently using a simple antenna geometry. There will nevertheless be a characteristic wave mode for which the coupling is strongest, and this will determine the power coupling efficiency of the antenna. In the prior art this is not especially well controlled or understood, because the field and plasma density vary strongly along the field direction.

In an electron cyclotron resonance (ECR) source, the microwave field geometry is determined by the launching wave guide. Power coupling is to the cyclotron motion of the electrons and efficient coupling requires that the cyclotron frequency closely matches the excitation frequency. If the D.C Magnetic field strength is strongly varying, this can only be achieved over a small volume of space. In both the helicon and ECR sources, therefore, there is a need for improved control and uniformity in the magnetic field in the source region.

SUMMARY OF THE INVENTION

From a first aspect the invention consists in a plasma processing apparatus including:
(a) a process chamber;
(b) an antenna or microwave source for radiating electromagnetic waves;
(c) a plasma generation chamber having a plasma zone and being generally orientated about an axis; being proximate to and in electromagnetic communication with the antenna or source and being for feeding ions and/or neutral particles to the process chamber; and
(d) a magnetic field generator for generating a magnetic field within the plasma generation chamber such that it extends generally parallel to the axis and passes from the chamber into the process chamber characterised in that the magnetic field generator and/or a further magnetic field generator converges the magnetic field at a location upstream of the plasma zone whereby electrons travelling along the magnetic field lines from the plasma generation chamber will be reflected towards the plasma zone and in that there is no electrically conductive path extending around or through the upstream location.

In principal any charged particle will be reflected at a converging field, but at the energies and field strengths, typical in many applications, the orbital radius of the ions will be about 4 cm, which is similar to the mean free path of the scattering gas and the distance to the walls. Hence collisions may cause some ions to pass through the convergent field at the upstream location.

However, provided that there is not a conductive path, for instance a conductive chamber wall, around the upstream location then this will not matter. This is because if some ions are scattered through the convergent field, but electrons are reflected, then the region within the chamber will have a negative net charge, which in turn will set an axial electric field within the chamber that will prevent the ions escaping.

This approach has a number of advantages. First a reduction in ion loss rates implies that less source power is required to sustain a plasma with a given density. Secondly, a reduction in ion loss rate allows a reduced ion creation rate, so a given plasma density can be produced at a lower electron temperature. This would mean that less power is used in electron heating, further increasing the power efficiency, and the number of species produced in low energy electron interactions (eg. negative ions, molecular fragments, reactive radicals) is increased changing the plasma chemistry in a way that may be beneficial for the plasma processing. Further there are fewer high energy electron collisions, such as those that heat the ions, so the ion temperature is also reduced. A low ion temperature is beneficial, if it is desired to produce a highly anisotropic ion velocity distribution, by accelerating the ions with an electric field in the direction of the substrate. This is often very desirable when processing high aspect ratio features.

In a preferred arrangement, the plasma generation chamber has two ends and the upstream location is adjacent to one end and the process chamber is at or is contiguous with the other end of the plasma generation chamber.

It is particularly preferred that the magnetic generator generates within the plasma generation chamber a field which is substantially uniform and substantially parallel to the axis. The Applicants have appreciated that the Lorentz force encourages the electrons to move in cyclotron orbits. If the orbital radius is less than the electron mean free path, the diffusion of electrons perpendicular to the magnetic field is strongly suppressed. Thus, if the field is orientated parallel to the chamber walls, the charge loss is suppressed. A reduced flow of charges to the chamber walls leads to reduced gradients in the plasma density and, therefore, to a more uniform processing environment. This enhanced uniformity will, the Applicants have appreciated, lead to increased efficiency in the coupling of the RF Power.

Electrons will be lost from the chamber, wherever the field has a component perpendicular to that chamber wall. Therefore, if the walls of the plasma generation chamber are not substantially parallel to the axis of the field then, the magnetic field generator may be arranged to provide an increased field strength as the non-parallel wall is approached.

An additional independent magnetic field generator may be provided for generating a field downstream of the plasma generation chamber. The magnetic field generator and the additional magnetic field generator may be sized such that the latter has a substantially zero net effect in the plasma generation chamber. The magnetic field generator may include a first coil for generating a magnetic field in the plasma generation chamber and a second coil for converging that field at the upstream location. The first and second coils are preferably powered by a single power source, whereas the additional magnetic field generator may be powered by a separate source. It is possible to configure the first and second coil contiguously such that they appear as a single coil such that there is a first coil part and a second coil part.

An advantage of having the additional magnetic generator is that the magnetic field in the process chamber can be controlled in such a way as to control the way in which the ions spread out and thus allow adjustment of the process effect on a substrate and hence increase control of the centre-to-edge profile.

The apparatus may further include a second further magnetic field generator for converging the magnetic field at a downstream location between the plasma generation zone and the process chamber.

If it is desired to allow ions through the downstream location, then there may be an electrically i.e electron conductive path from the plasma generation chamber around, or through the downstream location. Alternatively there may be no electrically conductive path around or through the downstream location and in that way both electrons and ions can be trapped at either end of the plasma zone due to the principal of charge equalisation. Where there is an electrically conductive path, the conductance of that path may be variable so that the rate of ion flow can be adjusted by adjusting the rate of electron flow. Equally the strength of the convergent magnetic field can be varied so that a window of axial field lines is created so some electrons, and hence ions, may pass through if desired. An axial field can allow the ions to arrive at the substrate in a highly anisotropic manner.

If the electron path is via the chamber wall around the downstream location, then for the ions to impinge usefully upon the substrate then it must be in DC connection with the chamber walls or negatively biased e.g. via an RF supply, if not, then ions that flow from the plasmas chamber will travel to the process chamber wall to recombine with the electrons thereby equalising charge. (Prior art publications have not made this apparent).

It is particularly preferred that there is a gas feed into the plasma generation chamber which passes through the upstream location. The gas can either be withdrawn in the process chamber or, if it is desired that no neutral particles enter the process chamber, it can be withdrawn upstream of that chamber.

From a further aspect the invention consists in a plasma processing apparatus including:
  (a) a process chamber,
  (b) an antenna for radiating electromagnetic waves,
  (c) a plasma generation chamber generally orientated about an axis and being proximate to and in electromagnetic communication with the antenna and for feeding ions and/or neutral particles to the process chamber; and
  (d) a magnetic field generator for generating a magnetic field within the plasma generation chamber such that it extends generally parallel to the axis and passes from the chamber into the process chamber characterised in that the magnetic field generator generates a field which is substantially uniform within the plasma generation chamber and substantially parallel to the axis thereof.

From a still further aspect the invention consists in a plasma processing apparatus including:
  (a) a process chamber,
  (b) an antenna or a microwave source for radiating electromagnetic waves
  (c) a plasma generation chamber having a plasma zone and being generally orientated about an axis being proximate to and in electromagnetic communication with the antenna and being for feeding particles to the process chamber; and
  (d) a magnetic field generator for generating a magnetic field within the plasma generation chamber such that it extends generally parallel to the axis and passes from the chamber into the process chamber characterised in that the magnetic field generator and/or a further magnetic field generator converges the magnetic field at a location downstream of the plasma zone whereby electrons travelling along the magnetic field lines will be reflected towards the plasma zone and in that there is either no electrically conductive or a controllable conductive path extending around or through the downstream location.

From yet another aspect the invention consists in a plasma processing apparatus including:
  (a) a process chamber,
  (b) an antenna or a microwave source for radiating electromagnetic waves
  (c) a plasma generation chamber having a plasma zone and being generally orientated about an axis; being proximate to and in electromagnetic communications with the antenna and being for feeding ions to the process chamber; and
  (d) a magnetic field generator for generating a magnetic field within the plasma generation chamber such that it extends generally parallel to the axis and passes from the chamber into the process chamber characterised in that there is a pumping outlet between the plasma generation and process chambers whereby neutral particles are removed and do not enter the process chamber.

Although the invention has been defined above it is to be understood it includes any inventive combination of the features set out above or in the following description.

BRIEF DESCRIPTION OF THE DRAWINGS

The invention can be performed in various ways and specific embodiments will now be described with reference to the accompanying drawings, in which.

DETAILED DESCRIPTION OF THE PREFERRED EMBODIMENTS

Figure 1:
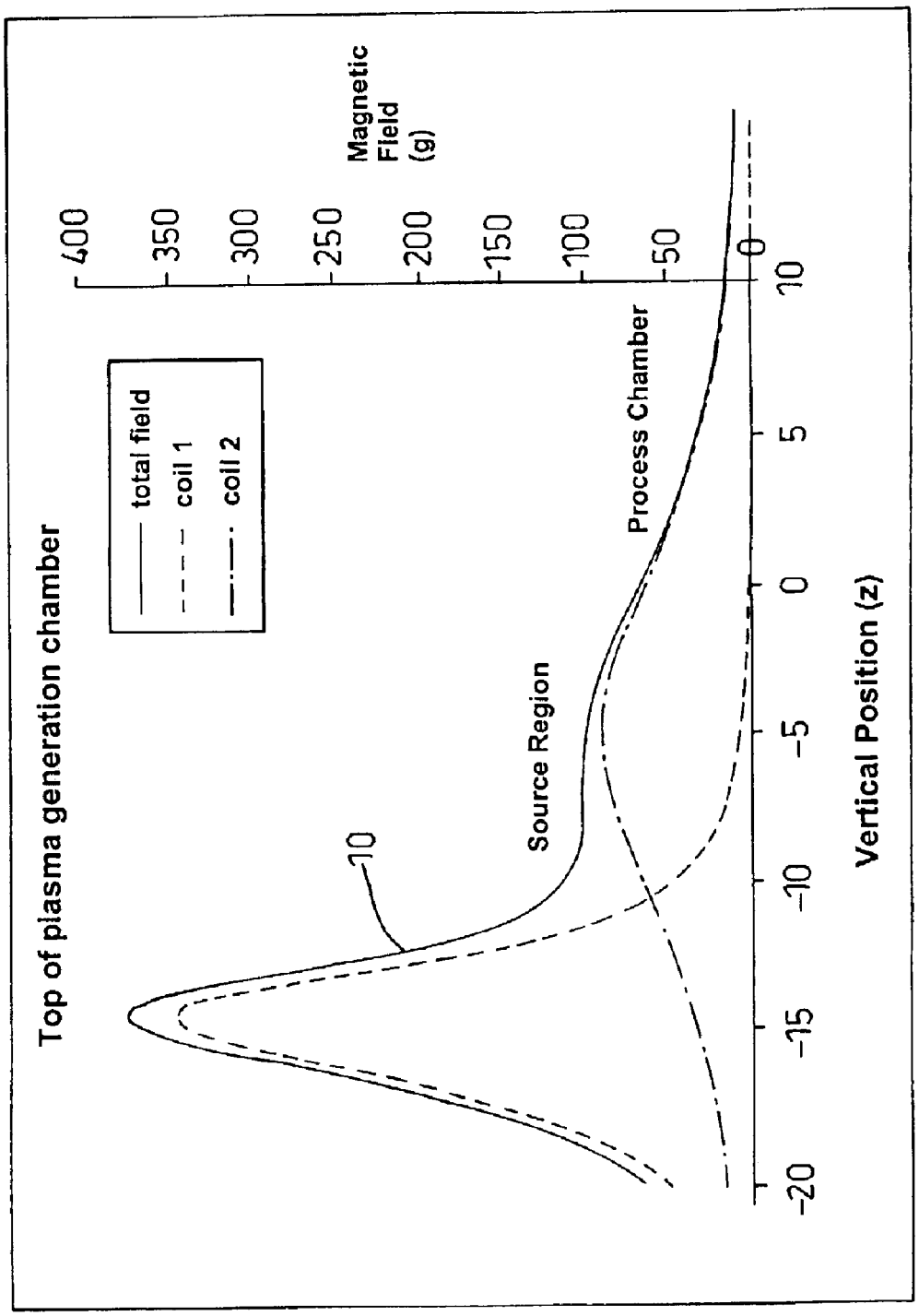
FIG. 1 shows one of the Applicants' preferred magnetic fields plotted against the position within the plasma generation and process chambers and the manner in which such a field may be approximated using two coils.

In FIG. 1 an idealised total field is indicated at 10 by plotting a magnetic field for the vertical position of an apparatus, of the type that will be described in more detail in connection with FIGS. 5 or 6, in which there is a plasma generation chamber surmounting a process chamber. As will be seen from the graph 10 the Applicants have determined that what is required is a highly uniform field in the source or plasma generation region, with a strong convergent field at the top of the plasma generation chamber and, in general, a reducing field in the process chamber. In some embodiments it may be desirable to have the field strength peak in the process chamber, before it reduces.

As has been indicated above, by selecting such a magnetic field profile, the Applicants are able to reflect the electrons, which would otherwise escape through the top of the plasma generation chamber, along the field lines and thereby trap electrons as previously described; to enhance the coupling in the source region and reduce the electron temperature; and to enhance uniformity of process in the process chamber. The trapping of the electrons is dependent on there being no conductive path around or through the strongly convergent field.

Figure 2:
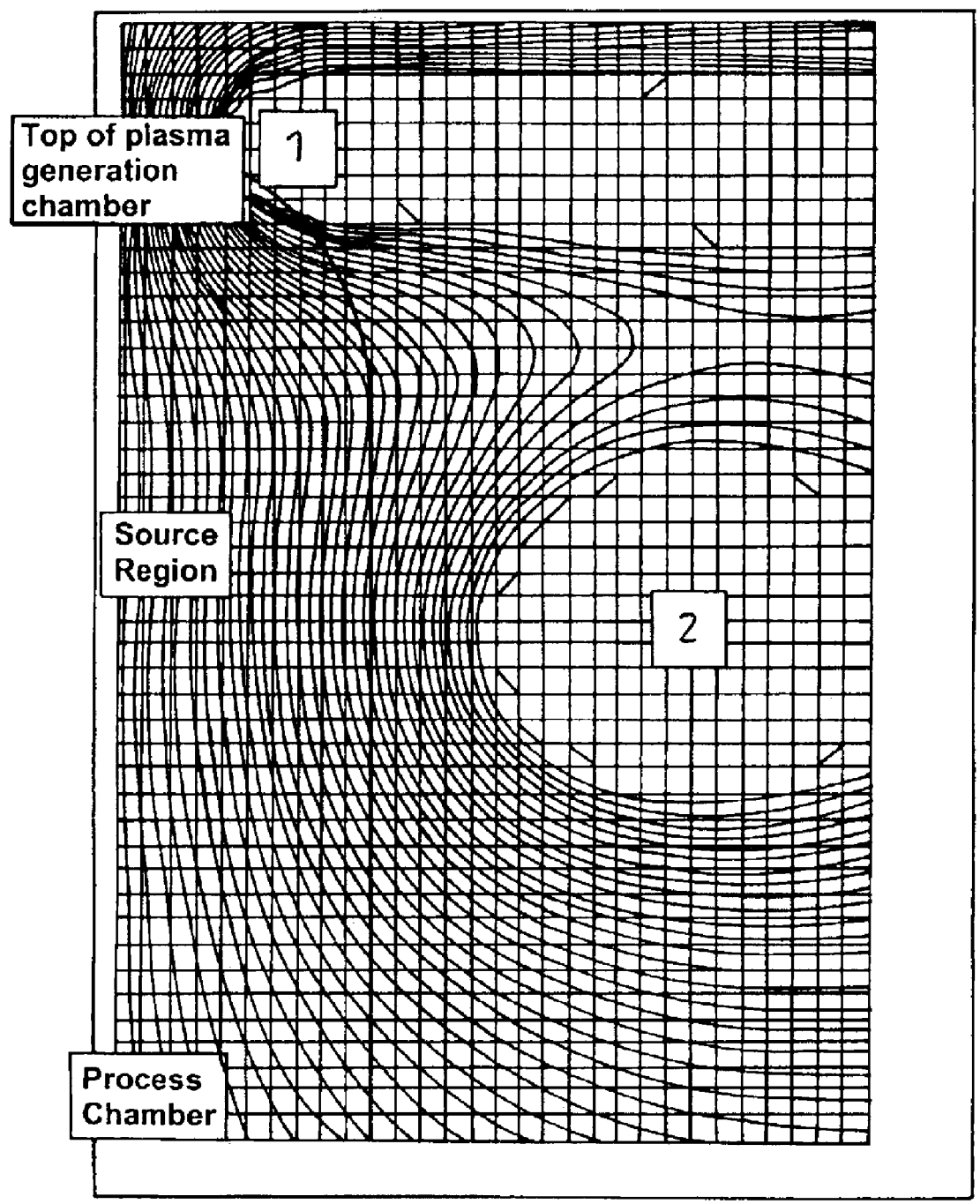
FIG. 2 is a schematic representation of magnetic field lines generated by the two coil system.
Figure 3:
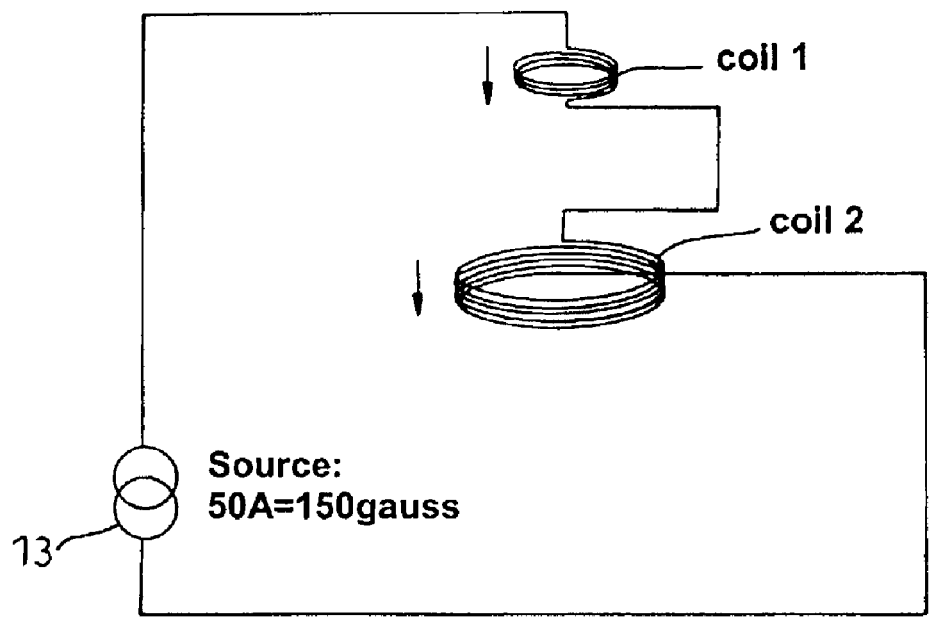
FIG. 3 is a circuit diagram illustrating the arrangement of the two coils.

By way of illustration, broken lines 11 and 12 illustrate how two magnetic coils combine to approximate the graph 10. For example one appropriate calculation, using two magnetic coils is for coil 1 at 1,650 Amp turns of radius of 3 cms, and Z of −15 cms for coil 2 to have 1,440 Amp turns of radius of 10 cms, and Z of −5 cms. FIG. 2 is a schematic two dimensional representation of the magnetic field lines generated by the coils 1 and 2 with 50 turns in coil 1 and 43 turns in coil 2, each coil carrying a current of 33 Amps. A uniform field of 100 gauss is generated in the source region rising to 400 gauss at the upstream end of the plasma generation chamber and dropping off downstream into the process chamber.

For arrangements involving two or more current carrying coils, an appropriate choice of the ratio of the number of turns will allow them to be connected in series and operate from a single current supply 13. By altering the current, the magnetic field strength in the source region can be varied easily, whilst its uniformity and the magnetic mirroring effect of coil 1 are maintained.

One of the benefits of the adoption of coil 1 is that the plasma is to a great extent kept away from the top of the plasma generation chamber, allowing sensitive equipment such as optical and electrical diagnostics, electrical feed throughs, gas feed lines etc to be mounted there with a reduced risk that they will be attacked or interfered with by the plasma.

Figure 4:
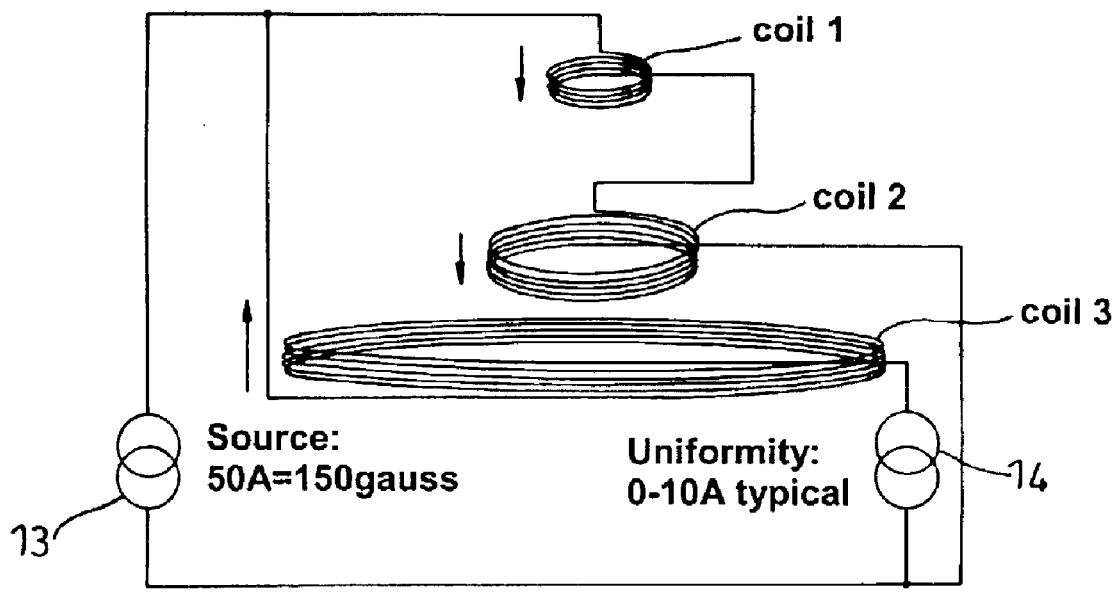
FIG. 4 is a circuit diagram illustrating the use of an additional coil.

Turning to FIG. 4 an additional coil or coils can be added, at a larger radius, to control the magnetic field strength in the process chamber. Conveniently this has a separate current source 14. With the circuit shown in FIG. 4, and with a suitable selection of the number of turns, the current which initially flows through coil 3, will also flow through coil 2 whereby it produces an equal and opposite field, in the source region, so that the field produced in the source region by coil 3 is effectively cancelled out and does not interfere with the field strength or uniformity in the source region. The FIG. 4 arrangement is particularly convenient, because it now enables the operator to have separate control of the magnetic field in the plasma chamber and to make the appropriate adjustments to enhance process uniformity, in dependence on the specific process being performed, the dimensions of the workpiece etc.

It will be appreciated that there are a whole range of magnetic sources that could be used to achieve the principle set out above. For example coil 1 could be replaced by a permanent magnet or an independent high current flat coil. A single coil could be used instead of coils 1 and 2 with a high permeability body adjacent the top of the plasma generation chamber. The plasma generation chamber could be configured with a permanent magnet at its upstream end.

For further improvement in uniformity, Coil 2 could be constructed as a Helmholtz pair, being two flat coils positioned coaxially with a vertical offset. FIGS. 5 and 6 illustrate the application of the three coil configuration to a helicon plasma source and an ECR apparatus respectively. In each the plasma generation chamber is indicated at 15 and the process chamber is indicated at 16. A workpiece support is provided at 17 and a workpiece 18 sits thereon. The plasma generation or source region is indicated at 19. Conveniently the chamber 15 is made of an electrically insulating material and this helps to ensure there is no electrically conductive path that bypasses the convergent field. In FIG. 5 an antenna 20 is driven by a RF power supply 21, whilst in FIG. 6 microwave power 26 is supplied to a wave guide 22 and enters the chamber 15 through a window 23.

The general construction and operation of such apparatus is well known in the art and further reference can be made to the earlier specifications mentioned above, which are incorporated for that purpose, by reference.

Figure 5:
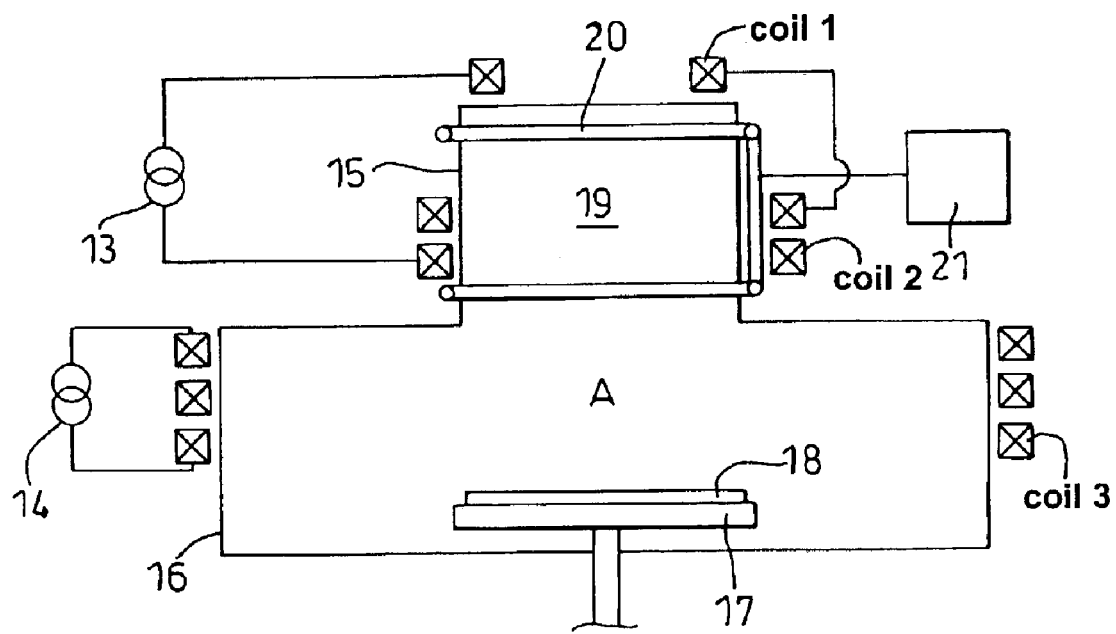
FIG. 5 is a schematic layout of helicon apparatus incorporating the FIG. 4 arrangement.
Figure 6:
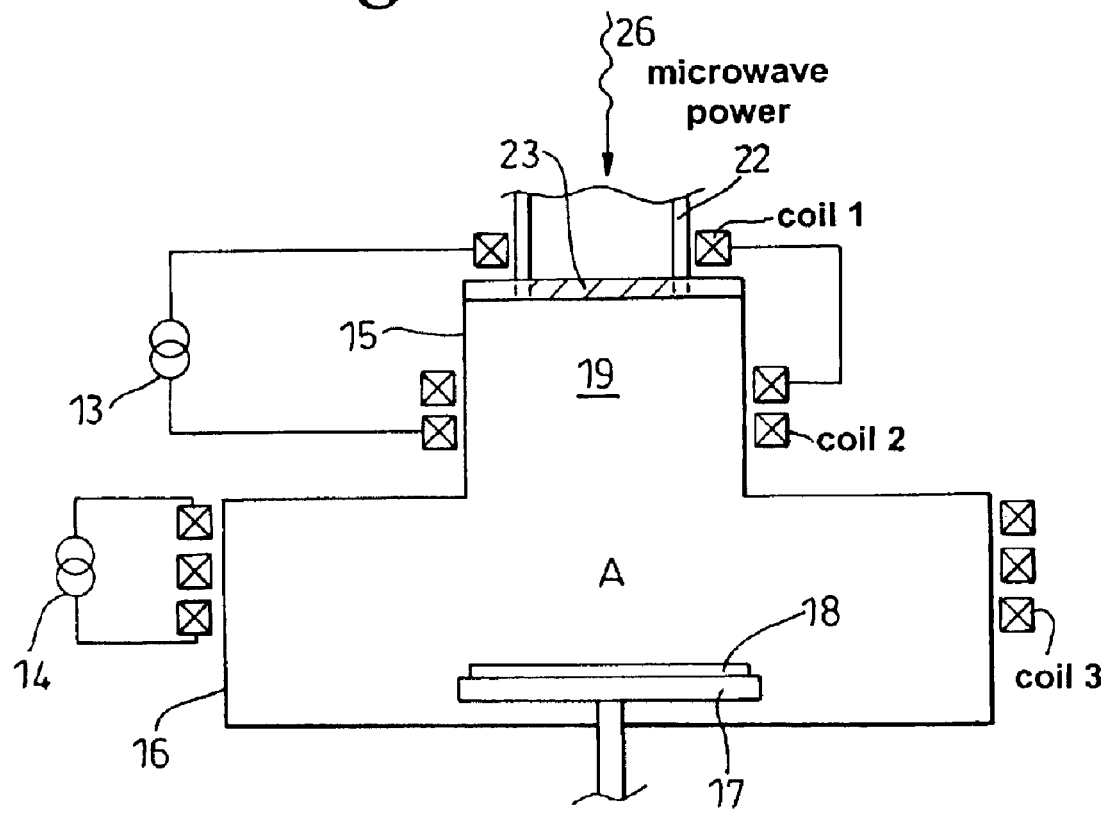
FIG. 6 is a schematic ECR apparatus incorporating the FIG. 4 arrangement.
Figure 7:
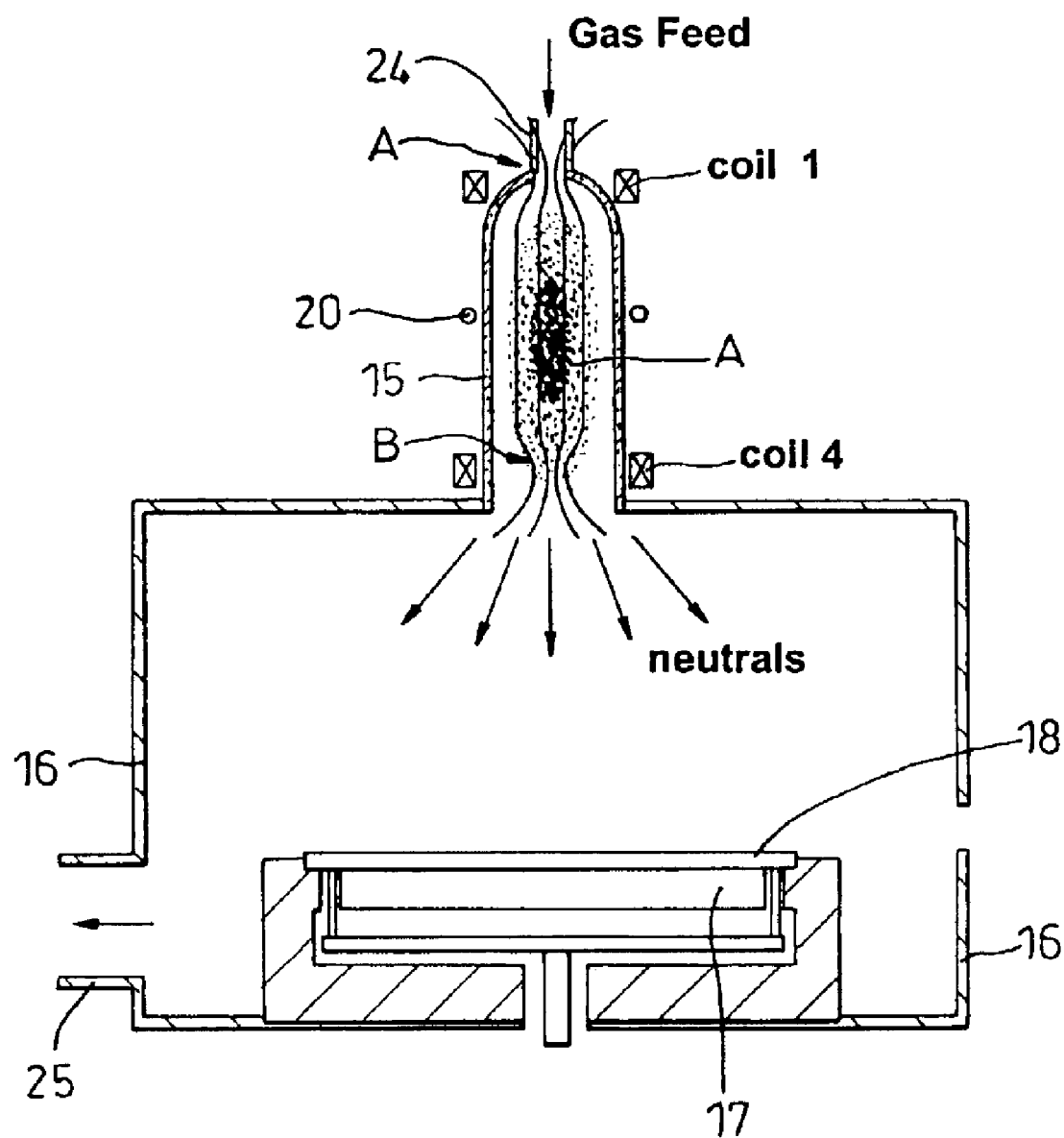
FIG. 7 is an alternative apparatus for providing a stream of neutral particles to the process chamber.

FIG. 7 shows a variation on the apparatus of FIG. 5. This apparatus is intended to provide a supply of purely neutral particles (e.g. free radicals) to the process chamber 16. In this arrangement there is also a convergent field at the downstream end of the plasma chamber 15, which in the schematically shown view is produced by coil 4. Coil 2 is omitted for clarity sake, but, as has already been indicated, particular magnetic field arrangements can be achieved with coils or permanent magnets working in combination. With the arrangement shown in FIG. 7 electrons are reflected at each end of the plasma generation chamber 15 at respective locations A and B. This chamber is of insulating material and so there is no path for the electrons to escape. Ions are therefore also trapped within the chamber 15.

A gas feed 24 is provided at the top of the chamber 15 to pass through the convergent field and the gas is withdrawn from the process chamber 16 at 25. Neutral particles are therefore drawn into the process chamber 16 with the flow of gas to react with the substrate 18 such as in etch or resist stripping processes. The apparatus may also be suitable for certain vapour deposition processes.

This arrangement is desirable because it produces a reactive, purely chemical, environment with extremely good power efficiency. There is no need for coil 3 as substantially no electrons (or ions) flow into the process chamber, and the process chamber can almost certainly be made out of aluminium. As the particles flowing into the process chamber are neutral, no bias is required for the support 17. This apparatus thus obviates the need for substrate (e.g. semiconductor wafer) bias, or a magnetic field in the process chamber, thus saving expense and complexity.

For best process uniformity, the pumping speed and pressure in chamber 16 should be such that the neutral particles diffuse to the substrate 18. Too high a pressure in the plasma chamber may promote diffusion of electrons from the magnetic confinement in the plasma source.

Figure 8:
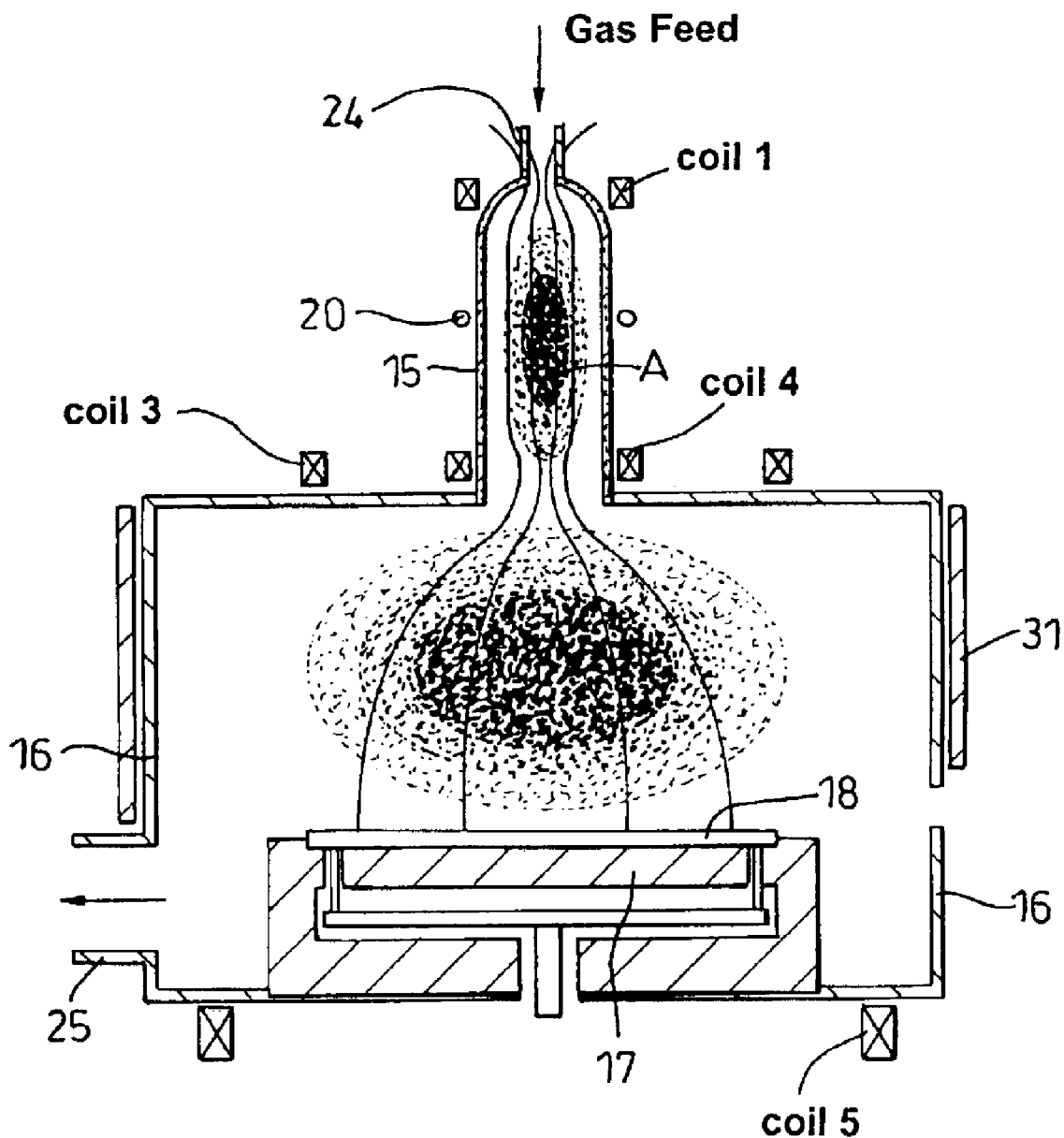
FIG. 8 is a corresponding arrangement for providing neutral particles, ions and electrons.

The FIG. 8 is similar to the arrangement of FIG. 7 except here it is intended that coil 4 should be powered to a lesser extent so that a controlled number of ions can escape, particularly at high pressures. Ion escape can preferably occur by the formation of a window in the magnetic field which allows a controllable flux of electrons, and hence ions, to pass into the process chamber in the direction of the substrate. Thus the ratios of ions to radicals can be continuously varied from zero up to the position where the apparatus is essentially that of FIG. 2. If ion flow is required at low pressures, it may be necessary to have a high resistance, or variable resistance electrically conducting leakage path from the chamber 15 to the chamber 16 so as to reduce the electric field effect.

As there is some flow of charged particles to the process chamber, a magnetic bucket 31 may be provided around the process chamber 16 and an optional coil 5 is shown at the base of the chamber which may be provided to enhance uniformity across the substrate 18. The support 17 may be RF biased to further enhance the anisotropic velocity distribution of the ions, and/or change the ion energy.

Figure 9:
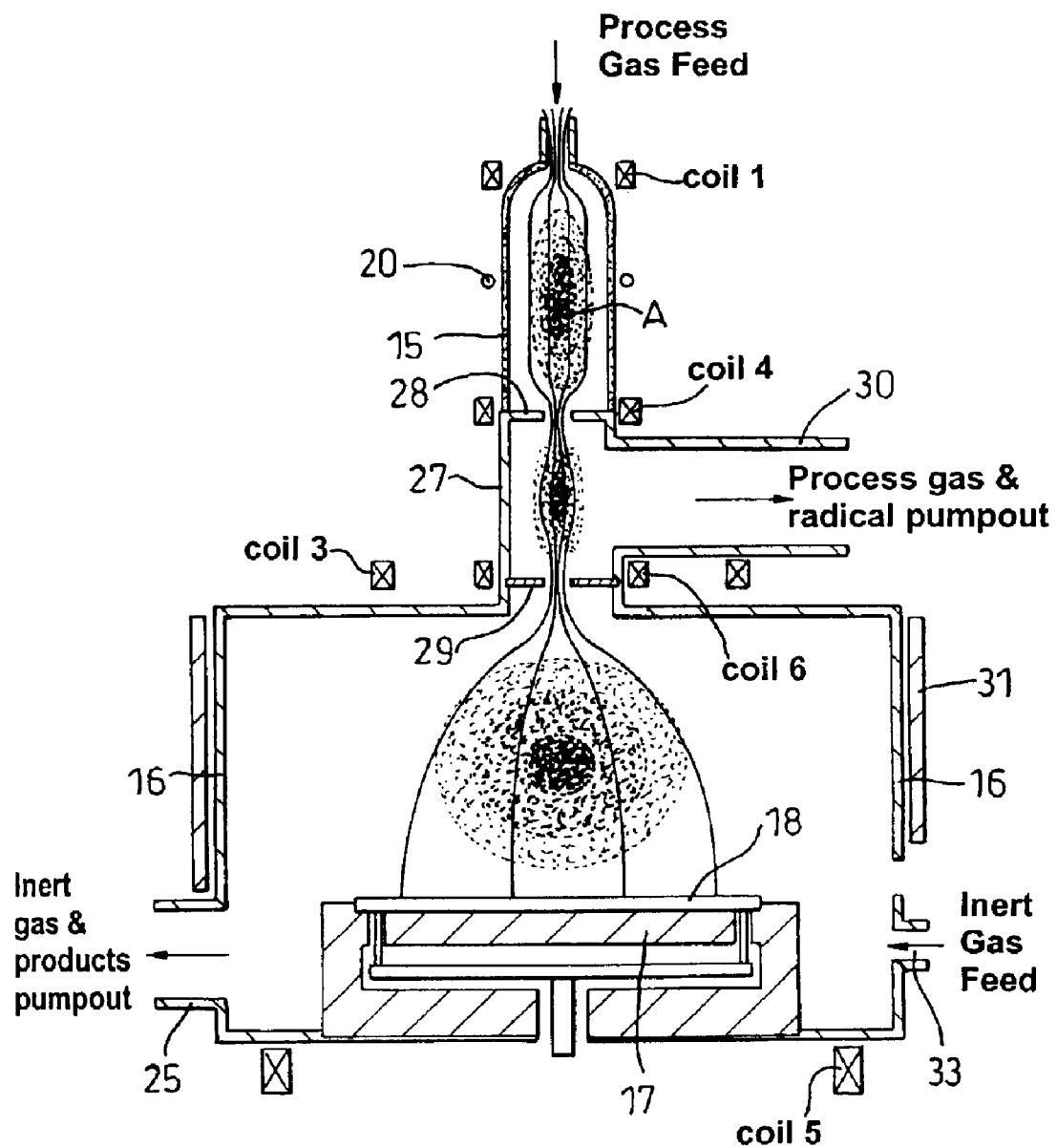
FIG. 9 is an arrangement which provides a source of ions and electrons.

FIG. 9 is a further development in which the process gas and radicals are pumped out of a buffer chamber 27 disposed between the plasma generation chamber 15 and the process chamber 16, a further coil 6, is located at the bottom end of the buffer chamber 27 to control the flow of ions and electrons. Baffles 28, 29 are provided at the upstream and downstream ends of the buffer chamber 27 to control the gas flow such that the process gas and radicals can be pumped out at 30 and it is probably desirable to have a flow of inert gas from an inlet 33 into the process chamber 16 to maintain higher pressure there.

The ions entering the process chamber would be extremely anisotropic and this arrangement may be particularly suitable for reactive ion processing, such as polysilicon etching, especially if anisotropy is at a premium and the etch rate is less important.

Figure 10:
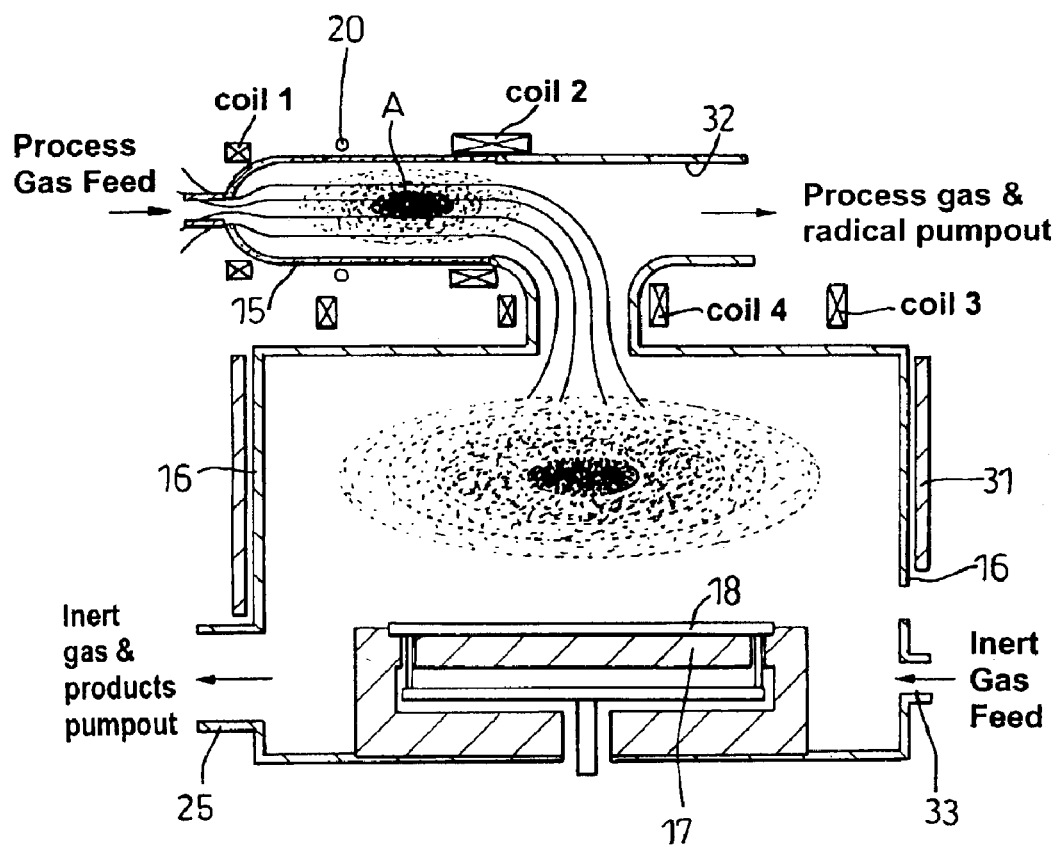
FIG. 10 illustrates an alternative arrangement for filtering ions and electrons.

FIG. 10 shows an alternative arrangement for providing a flow of charged particles with no, or reduced radicals, into the process chamber 16. Here the plasma generation chamber 15 is turned through 90 degrees to avoid illumination of the substrate by e.g. ultraviolet light and coils 2 and 4 are arranged to guide the charged particles' into the process chamber 16, whilst the process gas and neutral radicals are pumped out in a linear flow at 32. An inert gas pressure may be maintained in the process chamber to prevent the entrance of radicals into the process chamber. Similarly, in each of the FIGS. 9 and 10 embodiments an inert gas can be introduced into the process chamber and pumped out at 25, along with the process gas and reaction products.

What is claimed is:

1. A plasma processing apparatus including:
   (a) a process chamber,
   (b) an antenna or a microwave source for radiating electromagnetic waves
   (c) a plasma generation chamber having a plasma zone and being generally orientated about an axis; and being proximate to and in electromagnetic communication with the antenna or source and being for feeding particles to the process chamber; and
   (d) a magnetic field generator for generating a magnetic field within the plasma generation chamber such that it extends generally parallel to the axis and passes from the chamber into the process chamber
   characterized in that the magnetic field generator and/or a further magnetic field generator converges the magnetic field at a location upstream of the plasma generation zone whereby electrons travelling along the magnetic field lines will be reflected towards the plasma zone and in that there is no electrically conductive path extending around or through the upstream location.

2. Apparatus as claimed in claim 1 wherein the plasma generation chamber has two ends and the location is adjacent one end and the process chamber is at or is contiguous with the other end of the plasma generation chamber.

3. Apparatus as claimed in claim 2, wherein an optical window or diagnostic apparatus is situated at or contiguous with the location.

4. Apparatus as claimed in claim 1 wherein the magnetic generator generates a field which is substantially uniform and substantially parallel to the axis within the plasma generation chamber.

5. Apparatus as claimed in claim 4 including an additional independent magnetic field generator for generating a field downstream of the plasma generation chamber.

6. Apparatus as claimed in claim 5 wherein the magnetic field generator and the additional magnetic field generator are sized such that the latter has a substantially zero net effect in the plasma generation chamber.

7. Apparatus as claimed in claim 1 claims wherein the magnetic generator means includes a first coil for generating a magnetic field in the plasma generation chamber and a second coil for converging that field.

8. Apparatus as claimed in claim 7 wherein the first and second coils are powered by a single power source.

9. Apparatus as claimed in claim 1 claims wherein the plasma generation chamber is a zone of the process chamber.

10. Apparatus as claimed in claim 1 further including a second further magnetic field generator for converging the magnetic field at a second location between the plasma generation chamber and the process chamber.

11. Apparatus as claimed in claim 10 wherein there is no electrically conductive path around or through the second location.

12. Apparatus as claimed in claim 10 where there is an electrically conductive path around or through the second location.

13. Apparatus as claimed in claim 12 wherein the conductance of the electrically conductive path around or through the second location is variable.

14. Apparatus as claimed in claim 12 wherein ions from the plasma chamber are directed to the workpiece by means of D.C. or RF connection to the workpiece support.

15. Apparatus as claimed in claim 10 including means for varying the strength of the second further magnetic field generator.

16. Apparatus as claimed in claim 1 further including a gas feed which passes through the first mentioned location.

17. Apparatus as claimed in claim 16 further including a gas outlet upstream of the process chamber.

18. A plasma processing apparatus including:
  (a) a process chamber,
  (b) an antenna for radiating electromagnetic waves
  (c) a plasma generation chamber generally orientated about an axis and being proximate to and in electromagnetic communication with the antenna and for feeding ions or neutral particles to the process chamber; and
  (d) a magnetic field generator for generating a magnetic field within the plasma generation chamber such that it extends generally parallel to the axis and passes from the chamber into the process chamber
  characterised in that the magnetic field generator generates a field which is substantially uniform within the plasma generator chamber and substantially parallel to the axis thereof.

19. Apparatus as claimed in claim 18 including an additional independent magnetic field generator for generating a field downstream of the plasma generation chamber.

20. Apparatus as claimed in claim 19 wherein the magnetic field generator and the additional magnetic field generator are sized such that the latter has a substantially zero net effect in the plasma generation chamber.

21. A plasma processing apparatus including:
  (a) a process chamber,
  (b) an antenna or a microwave source for radiating electromagnetic waves
  (c) a plasma generation chamber having a plasma zone and being generally orientated about an axis; being proximate to and in electromagnetic communication with the antenna or microwave source and being for feeding particles to the process chamber; and
  (d) a magnetic field generator for generating a magnetic field within the plasma generation chamber such that it extends generally parallel to the axis
  characterised in that the magnetic field generator and/or a further magnetic field generator converges the magnetic field at a location downstream of the plasma zone whereby electrons travelling along the magnetic field lines will be reflected towards the plasma zone and in that there is either no electrically conductive or a controllable conductive path extending around or through the downstream location.

22. Apparatus as claimed in claim 21 wherein the magnetic generator generates a field which is substantially uniform and substantially parallel to the axis within the plasma generation chamber.

23. Apparatus as claimed in claim 21 wherein the magnetic field generator and further magnetic field generator for converging the magnetic field are powered by a single power source and/or are a single assembly.

24. Apparatus as claimed in claim 21 wherein the plasma generation chamber is a zone of the process chamber.

25. Apparatus as claimed in claim 21 wherein ions from the plasma chamber are directed to the workpiece by means of D.C. or RF connection to the work piece support.

26. Apparatus as claimed in claim 21 including means for varying the strength of the second further magnet field generator.

27. Apparatus as claimed in claim 21 claims further including a gas feed which passes through the upstream location.

28. Apparatus as claimed in claim 27 further including a gas outlet upstream of the process chamber.

29. A plasma processing apparatus including:
  (a) a process chamber,
  (b) an antenna or a microwave source for radiating electromagnetic waves
  (c) a plasma generation chamber generally orientated about an axis and being proximate to and in electromagnetic communication with the antenna or microwave source and for feeding ions to the process chamber; and
  (d) a magnetic field generator for generating a magnetic field within the plasma generation chamber such that it extends generally parallel to the axis and passes from the chamber into the process chamber characterised in that there is a pumping outlet between the plasma generator and process chambers whereby neutral particles are removed and do not enter the process chamber.

30. A plasma processing apparatus including:
  (a) a process chamber,
  (b) an antenna or a microwave source for radiating electromagnetic waves
  (c) a plasma generation chamber having a plasma zone and being generally orientated about an axis; being proximate to and in electromagnetic communication with the antenna or source and being for feeding ions to the process chamber; and
  (d) a magnetic field generator for generating a magnetic field within the plasma generation chamber such that it extends generally parallel to the axis and passes from the chamber into the process chamber, the magnetic field generator and/or a further magnetic field generator converges the magnetic field at a location downstream of the plasma zone whereby electrons travelling along the magnetic field lines will be partially reflected towards the plasma zone characterised in that the magnetic field at the location is variable to allow the transmission of a controllable flux of electrons lines through the downstream location and in that there is either no electrically conductive, or a controllable conductive path extending around or through the downstream location and in that there is no electrically conductive path or there is a controllable conductive path excluding around or through the downstream locations.

31. Apparatus as claimed in claim 30 wherein the magnetic generator generates a field which is substantially uniform and substantially parallel to the axis within the plasma generation chamber.

32. Apparatus as claimed in claim 31 including an additional independent magnetic field generator for generating a field downstream of the plasma generation chamber.

33. Apparatus as claimed in claim 32 wherein the magnetic field generator and the additional magnetic field generator are sized such that the latter has a substantially zero net effect in the plasma generation chamber.

34. Apparatus as claimed in claim 30 wherein the magnetic generator means includes a first coil for generating a magnetic field in the plasma generation chamber and a second coil for converging that field.

35. Apparatus as claimed in claim 34 wherein the first and second coils are powered by a single power source.

36. Apparatus as claimed in claim 30 wherein the plasma generation chamber is a zone of the process chamber.

37. Apparatus as claimed in claim 30 further including a gas feed which passes through the first mentioned location.

38. Apparatus as claimed in claim 37 further including a gas outlet upstream of the process chamber.

39. Apparatus as claimed in claim 30 wherein the process gas and neutral radicals are pumped out in a linear flow and the charged particles are guided into the process chamber.

40. Apparatus as claimed in claim 13 wherein ions from the plasma chamber are directed to the workpiece by means of D.C. or RF connection to the workpiece support.

41. Apparatus as claimed in claim 22 wherein the plasma generation chamber is a zone of the process chamber.

* * * * *